United States Patent [19]

Sugoh et al.

[11] Patent Number: 5,122,683
[45] Date of Patent: Jun. 16, 1992

[54] ECL CIRCUIT WITH FEEDBACK CONTROLLED PULL DOWN IN OUTPUT

[75] Inventors: Takeshi Sugoh, Yokosuka; Yasuhiro Sugimoto, Yokohama, both of Japan

[73] Assignee: Kabushiki Kaisha Toshiba, Kanagawa, Japan

[21] Appl. No.: 646,207

[22] Filed: Jan. 28, 1991

[30] Foreign Application Priority Data

Jan. 31, 1990 [JP] Japan .................................. 2-21557

[51] Int. Cl.$^5$ ...................... H03K 19/086; H03K 3/01
[52] U.S. Cl. .................................. 307/455; 307/270; 307/454
[58] Field of Search ................. 307/475, 270, 454, 455

[56] References Cited

U.S. PATENT DOCUMENTS

| | | | |
|---|---|---|---|
| 4,539,493 | 9/1985 | Varadarajan | 307/455 |
| 4,629,913 | 12/1986 | Lechner | 307/475 |
| 4,687,953 | 8/1987 | Varadarajan | 307/270 |
| 4,835,420 | 5/1989 | Rosky | 307/475 |
| 4,948,991 | 8/1990 | Schucker et al. | 307/455 |
| 4,970,416 | 11/1990 | Tamegaya | 307/455 |
| 5,041,743 | 8/1991 | Matsumoto | 307/455 |

FOREIGN PATENT DOCUMENTS 0314139  5/1989  European Pat. Off. .
0340725 11/1989  European Pat. Off. .

Primary Examiner—Edward P. Westin
Assistant Examiner—Richard Roseen
Attorney, Agent, or Firm—Banner, Birch, McKie & Beckett

[57] ABSTRACT

An ECL circuit is designed such that at the beginning of the falling of the output level, the current flowing to an output terminal is rapidly led in the direction where it will be reduced, the potential of the output terminal at this time is directly detected, and a pull down transistor is controlled through a feedback loop, thus assuring high-speed operation and low power consumption. A control circuit is provided to regulate the collector current of the pull down transistor, which is used to drop the level of the potential at the output terminal. This control circuit is so designed that the base current of the pull down transistor is controlled by the operation of another, single transistor, and no capacitor which will obstruct the circuit integration is employed to drive the pull down transistor. The structure of this circuit is therefore advantageous in realizing higher integration.

6 Claims, 2 Drawing Sheets

ECL CIRCUIT WITH FEEDBACK CONTROLLED PULL DOWN IN OUTPUT

BACKGROUND OF THE INVENTION

1. Field of the Invention

The present invention relates to an ECL (Emitter Coupled Logic) circuit which requires high-speed operation and low power consumption.

2. Description of the Related Art

In the prior art (FIG. 1), the rising speed of an output waveform is determined by the current flow from the emitter follower of an output transistor. On the other hand, the falling speed is determined by the discharging of charges in a load capacitor $C_L$ through a resistor $R_{EF}$ connected to the emitter of the output transistor. To increase the speed, therefore, the value of the resistor $R_{EF}$ has only to be reduced. However, this undesirably increases the current consumption. The prior art cannot therefore increase the falling speed of the output without increasing the power dissipation.

According to the structure as disclosed in U.S. Pat. Nos. 4,629,913, 4,539,493, 4,687,953, 4,835,420, the output stage is designed to have a totem pole structure with the upper transistors constituting a conventional emitter follower and the lower transistor forming a differential waveform using the capacitor C, so that operating this lower transistor at the falling time of the output discharges the charges from the load capacitor $C_L$. This arrangement can improve the falling speed of the output by increasing the capacitance of the capacitor C. Increasing the capacitance of the capacitor, however, increases the area of the capacitor, which will hinder circuit integration and thus result in design restriction.

SUMMARY OF THE INVENTION

It is therefore an object of the present invention to provide an ECL circuit which can realize low power consumption and high-speed operation without any design restriction to obstruct the circuit integration.

To achieve this object, there is provided an ECL circuit comprising: first and second transistors having emitters connected to each other to form a differential pair; an input terminal connected to a base of the first transistor; a third transistor having a base connected to a collector of the first transistor, and an emitter connected to an output terminal; a fourth transistor having a base connected through a diode to a collector of the second transistor, and a collector connected to the output terminal; and a control circuit for controlling a collector current of the second transistor in accordance with a collector current of the fourth transistor.

According to the structure described above, when the output level falls, the fourth transistor instantaneously discharges a load capacitor to be connected to the output terminal. Then, the control circuit regulates the collector current of the fourth transistor for direct discharge from the output terminal. This operation reduces the wasteful power consumption more than needed.

BRIEF DESCRIPTION OF THE DRAWINGS

The accompanying drawing, which is incorporated in and constitutes a part of the specification, illustrates a presently preferred embodiment of the invention and, together with the general description given above and the detailed description of the preferred embodiment given below, serves to explain the principles of the invention.

DETAILED DESCRIPTION OF THE PREFERRED EMBODIMENTS

A preferred embodiment of the present invention will now be described referring to the accompanying drawing.

Figure 1:
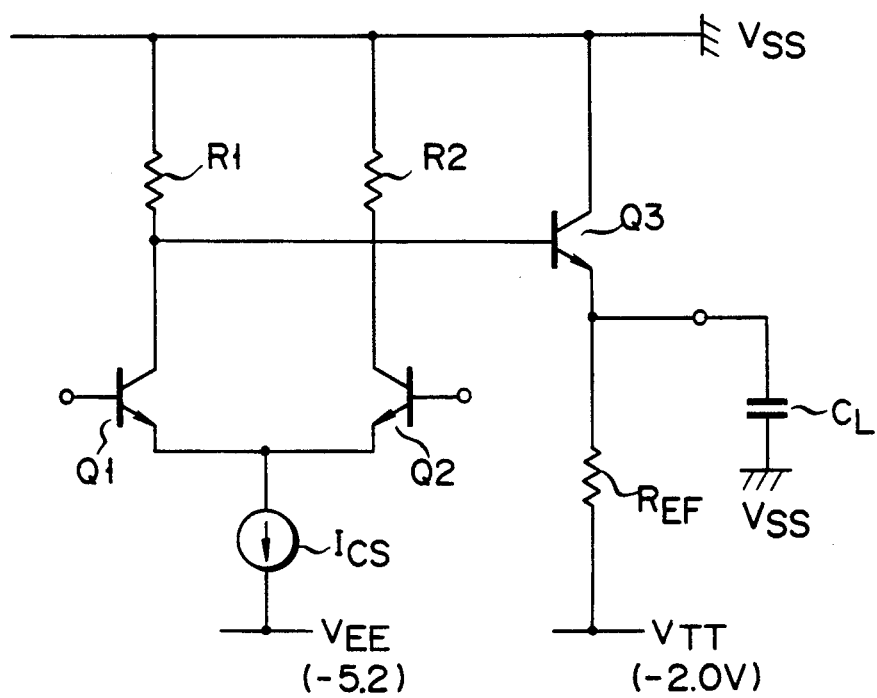
FIG. 1 is a circuit diagram illustrating the structure of a prior ECL circuit.
Figure 2:
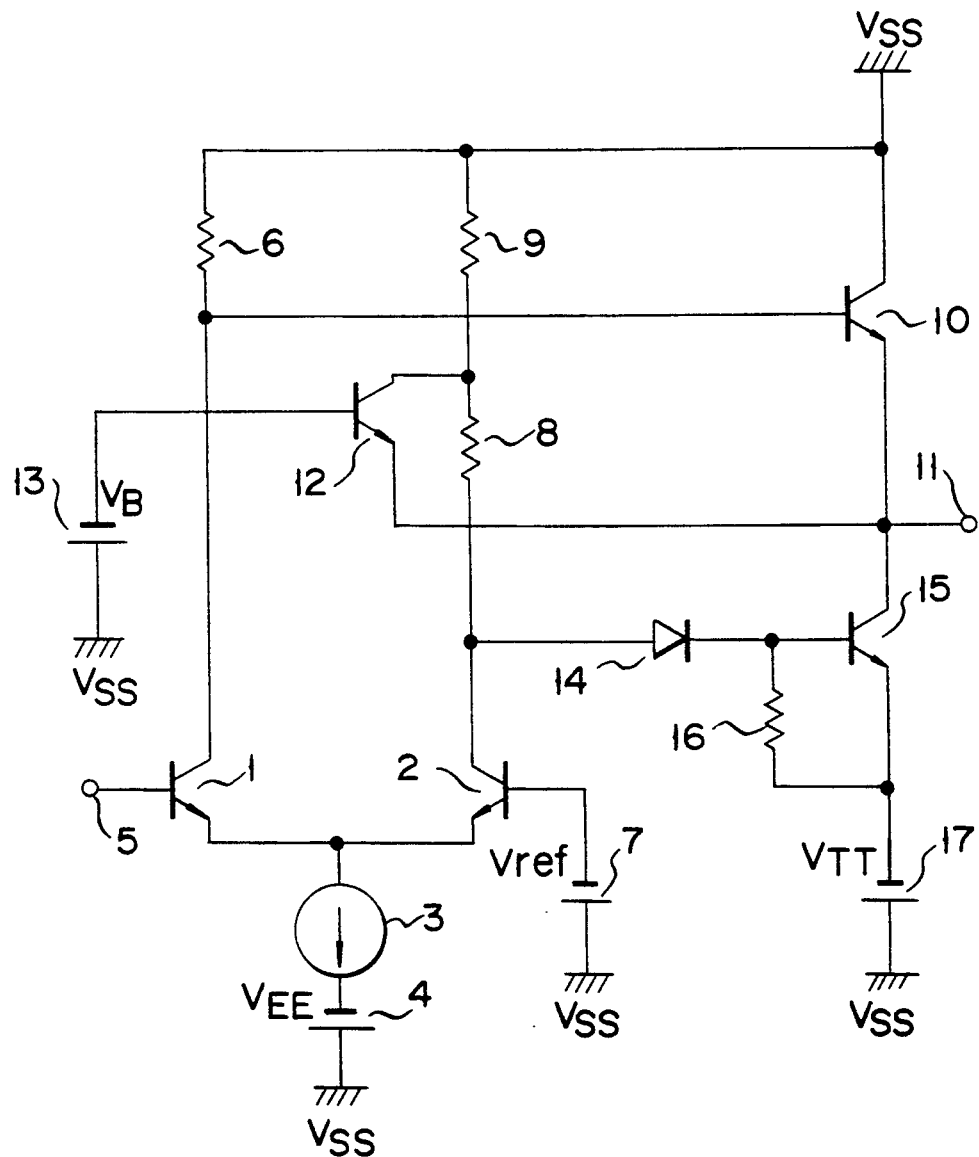
FIG. 2 is a circuit diagram illustrating the structure of an ECL circuit according to one embodiment of the present invention.

FIG. 2 illustrates the circuit structure of the embodiment of the ECL circuit according to the present invention as applied to constitute an inverter circuit.

A differential pair of NPN transistors 1 and 2 have their emitters commonly connected to a constant-current supply 3, which is connected to a constant-voltage supply 4. As the potential on the positive side (+) of the voltage supply 4 is connected to a ground voltage $V_{SS}$, the current from the current supply 3 flows to a negative power supply voltage $V_{EE}$ on the negative side (−). An input terminal 5 is connected to the base of the transistor 1, while the ground voltage $V_{SS}$ is connected to the collector of the transistor 1. Between the collector of the transistor 1 and the ground voltage $V_{SS}$ is located a resistor 6. A constant-voltage supply 7 is connected between the base of the transistor 2 and the ground voltage $V_{SS}$, and a predetermined reference voltage $V_{ref}$ whose value is between $V_{SS}$ and $V_{EE}$ is applied to the base of the transistor 2. The collector of the transistor 2 is also connected to the ground voltage $V_{SS}$. Between the collector of the transistor 2 and the ground voltage $V_{SS}$, resistors 8 and 9 are connected in a series.

The collector of the transistor 1 is connected to the base of an output NPN transistor 10. The transistor 10 has its collector connected to the ground voltage $V_{SS}$, and its emitter connected to an output terminal 11. An NPN transistor 12 has its collector connected to the contact point of the resistors 8 and 9 and its emitter connected to the output terminal 11. A constant-voltage supply 13 is inserted between the base of the transistor 12 and the ground voltage $V_{SS}$, and a predetermined negative voltage $V_B$ whose value is between $V_{SS}$ and $V_{EE}$ is applied to the base of the transistor 12.

A diode 14 has its anode connected to the collector of the transistor 2, and its cathode connected to the base of an NPN transistor 15. The collector of this transistor 15 is connected to the output terminal 11. The emitter and the base of the transistor 15 are connected to each other through a resistor 16. A constant-voltage supply 17 is arranged between the emitter of the transistor 15 and the ground voltage $V_{SS}$, a predetermined negative voltage $V_{TT}$ whose value is between $V_{SS}$ and $V_{EE}$ is supplied to the emitter of the transistor 15.

The operation of the circuit with the above structure will now be explained. When a signal at the input terminal 5 falls, the collector potential of the transistor 1 of the differential pair rises. As a result, the base potential of the transistor 10 rises, and the transistor 10 is switched on, sending an "H" level (high level) signal to the output terminal 11. Since the collector potential of the transistor 2 of the differential pair is low at this time, no current, which is large enough to turn of the transistor 15, flows to the diode 14, and the transistor 15 is therefore in an OFF state. Further, as the emitter potential of the transistor 12 has been increased due to the ON state of the transistor 10, the transistor 12 is in an OFF state.

When the signal of the input terminal 5 rises, the transistor 1 is switched on, and the collector potential of the transistor 2 rises. The current flows to the diode 14 in accordance with the collector potential, so that the transistor 15 is rendered on, reducing its collector potential. The potential of the output terminal 11, therefore, falls down to an "L" level (low level). The transistor 12, whose emitter is connected to the collector of the transistor 15, is turned on as the emitter potential decreases. Accordingly, the collector potential of the transistor 2 drops, thus decreasing the base potential of the transistor 15. The output terminal 11 is stably kept at the "L" level.

With the above circuit arrangement, when the signal at the input terminal 5 rises, a differential pulse is supplied to the base of the transistor 15. It is therefore sufficient to permit a large current to instantaneously, not constantly, flow through the collector of the transistor 15. Therefore, the "L" level current is stably output, and the power consumption can be reduced.

A capacitor which interferes with integration is not used to drive the transistor 15 to lower the potential level of the output terminal 11, so that the circuit with the above structure is advantageous in realizing the integration. In other words, this circuit structure is most suitable for higher integration, because the collector current potential of the transistor 15 is used to lower the potential level of the output terminal 11 according to this embodiment, and the control circuit to control the collector current is so designed that the base current of the transistor 15 is controlled by the operation of a single transistor 12. The timings at which the transistor 12 is switched on and off are determined according to the divided resistance of the resistors 8 and 9, and the voltage $V_B$ of the voltage supply 13.

According to the present invention as described above, at the beginning of the falling of the output level, the current flowing to the output terminal 11 is rapidly led toward the direction where it will be reduced, the potential of the output terminal 11 at this time is directly detected, and the transistor 15 is controlled through a feedback loop. With this structure, high-speed operation and low power consumption are assured.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents

What is claimed is:

1. An ECL circuit comprising:
   first and second transistors having emitters connected to each other to form a differential pair;
   an input terminal connected to a base of said first transistor;
   a third transistor having a base connected to a collector of said first transistor, and an emitter connected to an output terminal;
   a fourth transistor having a base connected through a diode to a collector of said second transistor, and a collector connected to said output terminal; and
   a control circuit for controlling a collector current of said second transistor in accordance with a collector current of said fourth transistor.

2. An ECL circuit according to claim 1, wherein said control circuit directly detects a potential at said output terminal and performs feedback control of a base current of said fourth transistor.

3. An ECL circuit according to claim 1, wherein said control circuit comprises a fifth transistor having a collector and an emitter connected between predetermined potential points, determined by dividing a load resistor element provided at said collector of said second transistor, and said output terminal, said fifth transistor being biased by a predetermined base potential.

4. An ECL circuit comprising:
   a differential pair including first and second transistors having emitters connected to each other;
   a third transistor having a base connected to one collector output of said differential pair;
   a fourth transistor having a base connected to the other collector output of said differential pair;
   a logic output terminal connected to an emitter of said third transistor and a collector of said fourth transistor; and
   a fifth transistor for detecting a potential at said logic output terminal and performing a feedback control of a collector output of said second transistor.

5. An ECL circuit according to claim 4, wherein said fifth transistor has a collector and an emitter connected between predetermined potential points, determined by dividing a load resistor element provided at said collector of said second transistor, and said logic output terminal, and is biased by a predetermined base potential.

6. An ECL circuit constituting an inverter circuit, comprising:
   first and second transistors forming a differential pair and each having a collector coupled to a first potential and an emitter coupled to a second potential;
   a constant-current supply inserted between said emitters of said first and second transistors and said second potential;
   an input terminal connected to a base of said first transistor;
   a first resistor element inserted between said collector of said first transistor and said first potential;
   a reference potential connected to a base of said second transistor;
   second and third resistor elements inserted between said collector of said second transistor and said first potential;
   a third transistor having a base connected to said collector of said first transistor, a collector connected to said first potential and an emitter connected to an output terminal;
   a fourth transistor having a collector connected to said output terminal and an emitter connected to a first predetermined potential;
   a fourth resistor element connected between a base and said emitter of said fourth transistor;
   a diode inserted between said collector of said second transistor and said base of said fourth transistor; and
   a fifth transistor having an emitter connected to said output terminal, a collector connected to a series-connected point of said second and third resistor elements and a base connected to a second predetermined potential.

* * * * *